United States Patent [19]

Stengel et al.

[11] Patent Number: 4,494,100

[45] Date of Patent: Jan. 15, 1985

[54] PLANAR INDUCTORS

[75] Inventors: Robert E. Stengel, Pompano Beach; Charles W. Nejdl, Ft. Lauderdale, both of Fla.

[73] Assignee: Motorola, Inc., Schaumburg, Ill.

[21] Appl. No.: 397,298

[22] Filed: Jul. 12, 1982

[51] Int. Cl.³ .............................................. H01F 5/00
[52] U.S. Cl. ................................................... 336/200
[58] Field of Search ...................... 336/200; 338/195; 29/847; 219/121 EK

[56] References Cited

U.S. PATENT DOCUMENTS

| | | | |
|---|---|---|---|
| 3,161,850 | 12/1964 | Klug | 338/195 |
| 3,436,687 | 4/1969 | Andrews, Jr. et al. | |
| 3,484,697 | 12/1969 | Abend | |
| 3,504,276 | 3/1970 | Proctor et al. | |
| 3,539,309 | 10/1970 | Helgeland | 219/195 X |
| 3,736,543 | 5/1973 | Lademann, et al. | |
| 4,012,703 | 3/1977 | Chamberlayne | |

OTHER PUBLICATIONS

IBM Technical Disclosure Bulletin, vol. 19, No. 10, Mar. 1977, "Double Flat Coil for Bubble Memory Package", K. J. Braun & D. G. McBride.

*Primary Examiner*—A. D. Pellinen
*Assistant Examiner*—Susan Steward
*Attorney, Agent, or Firm*—Jerry A. Miller; James W. Gillman; Edward M. Roney

[57] ABSTRACT

A planar inductance element includes a generally flat substrate of electrically insulating material. First and second substantially flat spiral coils, having respective inner and outer ends, are disposed on opposite sides of the substrate. The coils are spiraled in the same direction as viewed from one side of the substrate with one coil spiraling out and one spiraling in. The inner ends of the coils are joined through the substrate to couple the coils in series. The outer ends of the coils provide terminals for the inductor. The means/methods are disclosed for discretely and progressively trimming the inductor.

8 Claims, 7 Drawing Figures

PLANAR INDUCTORS

BACKGROUND AND SUMMARY OF THE INVENTION

This invention relates generally to inductance elements and particularly to planar inductors deposited on an electrically insulating substrate.

The word spiral as used herein is intended to encompass a broad class of structures which exhibit a clockwise or counterclockwise outwardly winding path beginning in a substantially centralized location in which each winding is successively longer than the previous winding. This definition is intended to embody generally rectangular, polygonal, oval, elliptical, and circular spirals as well as other irregular yet generally spiraling shapes. For illustrative purposes, generally circular spirals are shown in most of the figures.

Electrical inductance elements commonly comprise three-dimensional wire coils which are cylindrically or helically wound. Mutual inductance between adjacent wire segments containing current flowing in the same direction causes an inductive effect. Thus, arranging a conductor in a wound coil configuration produces an inductance because of the mutual parallel arrangement of the wire segments carrying the current. Problems are encountered in utilizing such known helically wound wire inductance coils in a printed circuit board or on a hybrid substrate because of the excessive three-dimensional area or space required by the wire wound coil. The limited space available for utilization by a printed circuit board often can actually prohibit the use of helically wound wire inductor coils.

Mere flat or planar spirally printed circuit elememts also are known and can achieve small inductance values. A planar spiral configuration is printed on one side of a substrate and can provide various values of inductance depending upon the geometry of the convoluted spiral. However, the use of such single planar spiral patterns itself is often limited by two-dimensional space limitations. It would be desirable to provide a planar spiral inductance element which achieves a maximum of mutual inductance and, therefore, a higher net inductance than a single spiral pattern for a given substrate area.

In addition, although methods are known for trimming three-dimensional wire inductor coils to vary the inductance values thereof, no efficient method is known for trimming or otherwise adjusting the value of flat or planar printed inductance elements.

An object of the present invention is to provide a new planar spiral inductance element which achieves a maximum of mutual inductance.

Another object of the present invention is to provide a new planar inductance element which achieves increased values of inductance for given two-dimensional areas.

A further object of the invention is to provide a two terminal planar inductance element which can be utilized in hybrid circuits on insulating substrates.

Still another object of the present invention is to provide a planar inductance element which is trimmable to provide variable values of inductance.

In the exemplary embodiment of the invention, a planar inductor is disclosed for use in electronic circuit apparatus or hybrid circuits on insulating substrates. A first substantially flat spiral coil is disposed on one side of the substrate and has an inner end and an outer end. A second substantially flat spiral coil is disposed on the opposite side of the substrate and also has an inner end and an outer end. The coils are spiraled in the same clock direction as viewed from one side of the substrate with one coil spiraling in and the other spiraling out. The inner ends of the coils are joined through the substrate to couple the coils in series. The outer ends of the coils provide terminals for the inductor, preferably leading away from the respective coils in generally diametrically opposite directions.

A novel feature of the invention is the provision of means for trimming the coils to vary the inductance thereof. In one form of the invention, the trimming means comprises substantially radially disposed conductive paths joining and shorting at least some of the spiral paths of one or both of the flat spiral coils. The conductive paths may be discretely and/or sequentially cut between the spiral paths to vary the inductance value thereof.

In another embodiment, the trimming means comprises a conductive layer of very low resistive material deposited on the substrate beneath one or both of the coils and shorting the spiral paths. This results in a continuously increasing inductance value depending upon the extent of trimming or severing of the conductive layer to electrically isolate a portion of the spiral path.

In a third embodiment, the trimming means comprises a conductive layer deposited on the insulating substrate. A pattern having inductive characteristics is cut in this conductive layer preferrably by laser.

Other objects, features and advantages of the invention will be apparent from the following detailed description taken in connection with the accompanying drawings.

DESCRIPTION OF THE DRAWINGS

The features of this invention which are believed to be novel are set forth with particularity in the appended claims. The invention, together with its objects and the advantages thereof, may be best understood by reference to the following description taken in conjuction with the accompanying drawings, in which like reference numerals identify like elements in the figures and in which:

DETAILED DESCRIPTION OF THE INVENTION

Figure 1:
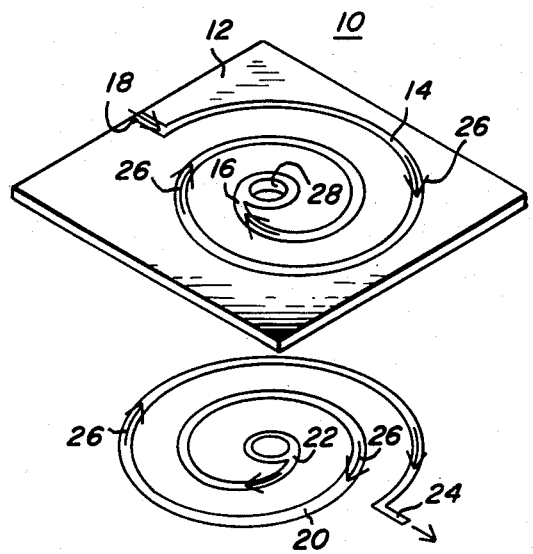
FIG. 1 is a partially exploded view of a planar inductance element in accordance with the present invention, showing spiral inductor patterns on opposite sides of a flat substrate.

Referring to the drawings in greater detail, and first to FIG. 1, a planar inductance element in accordance with the present invention is shown and generally indicated 10. Inductor 10 generally operates on the theory of mutual inductance between adjacent current carrying segments containing current flowing in the same direction to cause an inductive effect. It will be seen that arranging planar conductors in spiral patterns on a flat substrate will produce an inductance because of the mutual parallel arrangement of the conductor segments carrying currents in the same direction. A combination of inductors is printed on the upper and lower surfaces of the substrate and allows a greater range of inductance because of the mutual interaction of the current flow. In fact, in the preferred embodiment the mutual inductance afforded by this inductor is approximately 25% greater than the value of two single spiral inductor paterns arranged in series in the same plane.

More particularly, inductor 10 includes a generally flat substrate 12 of insulating material such as ceramic. In another embodiment, the substrate could be a flexible material such as polyimide, Teflon TM, polyester or other materials commonly used in flex circuits. After fabrication is complete, these substrates may be deformed into any desirable shape for packaging considerations. A first substantially flat spiral coil 14 is disposed on one side of the substrate, the top side as shown in FIG. 1. Spiral coil 14 is shown to spiral in a clockwise direction as viewed from above and has an inner end 16 and outer end 18. A second substantially flat spiral coil 20 is disposed on the opposite side of substrate 12 and has an inner end 22 and an outer end 24 coil 20 spirals out in the clockwise direction as viewed from above. The coils are spiralled in the same direction as viewed from one side of the substrate, and current flows in the same direction as indicated by arrows 26. In the preferred embodiment coils 14 and 20 have the same number of turns and occupy substantially the same substrate area.

Inner ends 16 and 22 of spiral coils 14 and 20, respectively, are electrically joined through a hole 28 in substrate 12 to couple the coils in series. Outer ends 18 and 24 of spiral coils 14 and 20, respectively, provide terminals for the inductor. As shown, the outer ends of the coils may lead away from the respective coils in generally diametrically opposite directions, but this is not to be limiting. Thus, a two terminal inductor is provided which can be utilized in hybrid circuits on insulating substrates, such as for utilization at RF frequencies.

It can be seen from FIG. 1 that when two flat spiral coils are placed on opposite sides of a substrate, and with the coils connected in series, the net inductance is much higher than employing either spiral coil alone. Mutual inductance exists between the spirals, and if wound on a 25 mil thick alumina substrate as shown in FIG. 1, the mutual effect adds to the net inductance, and the result is on the order of 2.5 times the inductance of a single spiral coil alone. In operation, the current entering top spiral coil 14 at the outer end 18 thereof continues in a clockwise manner closing until it reaches the center pass-through hole 28. The current flows to the inner end 22 of the lower spiral coil 20 and continues in an opening clockwise manner to eventually exit from the lower surface of substrate 12 at the outer end 24 of coil 20.

Figure 2:
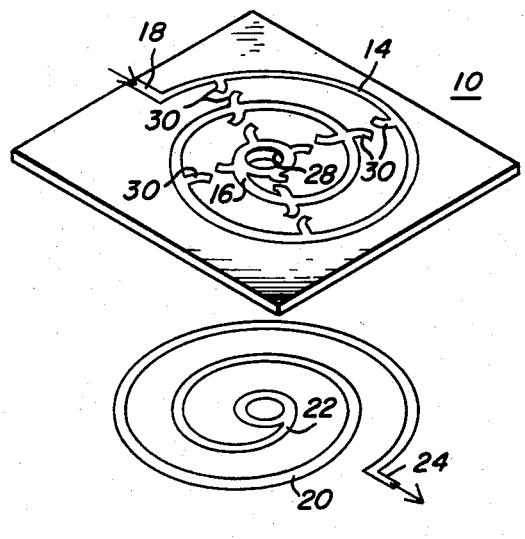
FIG. 2 is a view similar to that of FIG. 1, with the top spiral inductor pattern being discretely trimmable.
Figure 3:
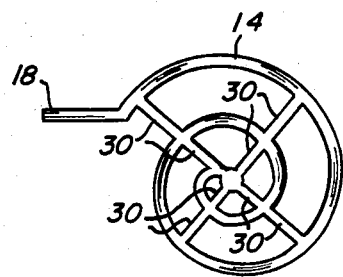
FIG. 3 is a plan view of a spiral flat conductor pattern having discretely trimmable shorting circuit portions radially disposed thereacross.

The present invention contemplates means and methods for selectively trimming planar inductance elements, and three different embodiments are disclosed. First, referring to FIGS. 2 and 3, radially disposed conductive paths 30 join and short the spiral paths of one or both spiral coils 14 and 20 providing means for descretely trimming inductor 10. FIG. 3 shows the spiral and shorting pattern before any trimming is effected. In essence, the mutual inductance between the parallel current carrying portions of coil 14 is substantially nullified by the shorting paths 30. Thus, the inductance value for the configuration shown in FIG. 3 is extremely small.

Referring back to FIG. 2, particularly the top portion thereof, it can be seen that the radial shorting paths 30 have been shown in exaggerated form as cut to permit a full inductance value for the inductor. It is readily understood that the radial shorting paths may be discretely trimmed from the outside of planar coil 14 progressively inwardly so that any desired length, in terms of units of angular arc for the parallel current carrying segments of coil 14, may be cut or trimmed so that the inductance value is discretely variable. This can be done, for example, by laser, or sandblast trimming. The same procedure may also be followed for flat spiral coil 20 on the opposite side of substrate 12 if dsired so that the resultant mutual inductance between the pair of flat spiral coils may be varied to a desired value within a relatively large predetermined range. This range is determined by the pattern, the thickness of the substrate, the number of convolutions or turns of the flat coils, and various other parameters. In addition, laser trimming has the advantage of a spiral pattern to be selected and individually trimmed during a later operation of assembly.

Figure 4:
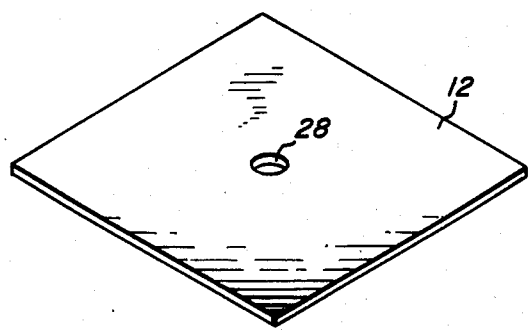
FIG. 4 is a perspective view of a flat substrate prior to depositing a progressively trimmable conductive layer thereon.
Figure 5:
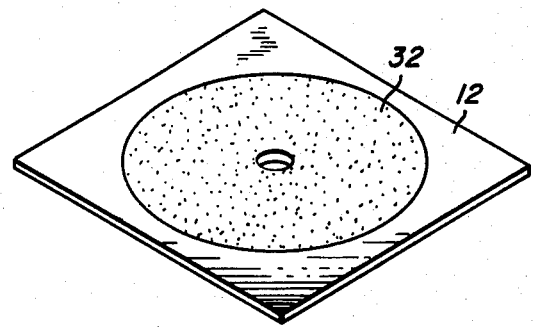
FIG. 5 is a perspective view of the substrate of FIG. 4, with a thin conductive layer deposited thereon.
Figure 6:
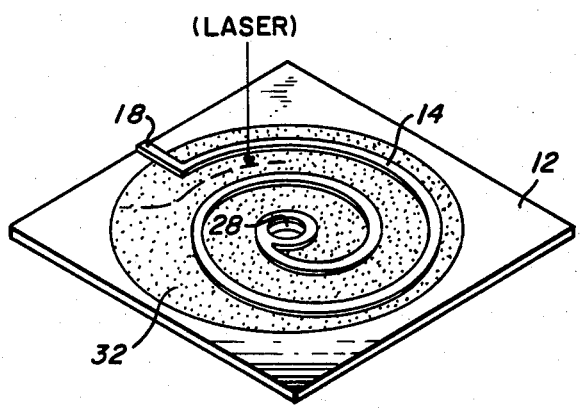
FIG. 6 is a perspective view of the substrate and deposited layer of FIG. 5, with a spiral inductor circuit deposited on the trimmable layer, shown to be served by a broken line.

Referring to FIGS. 4–6, other means and methods of trimming a planar inductor element in accordance with the present invention are illustrated. FIG. 4 shows a substrate 12 having a through hole 28. Before depositing a flat spiral coil 14 on the substrate, a layer 32 (FIG. 5) of low resistive material is deposited on the substrate where the flat spiral coil pattern will subsequently be deposited. A resistance of 5 ohms per square or less should prove suitable for many applications but this is not to be limiting. Layer 32 can be deposited by a suitable process such as an evaporation or sputtering process. Low resistance nichrome or copper material may be used and such processes are well known in the art. It will be evident to those skilled in the art that the material may alternatively be deposited subsequent to deposition of the spiral pattern.

After layer 32 has been deposited as shown in FIG. 5, flat spiral coil 14 then is deposited on top of the previously deposited conductive layer. The result is a spiral pattern with its convolutions or turns shorted by the conductive material of the layer and the inductance of the coil is almost completely nullified. In order to trim the inductor and increase the inductance value thereof, layer 32 is laser cut between the spiral convolutions of the coil progressively from the outside or inside thereof that is from the open or closed portions of the spiral, resulting in a continuously increasing inductance value depending upon the spiral extent of cutting the conductive layer. Of course, coil 20 on the bottom of substrate 12 similarly may be deposited on a layer 32 of very low resistance conductive material and similarly trimmed.

A third means and method of trimming a planar inductor element is similar to the previous means and method. In this embodiment, a conductive layer 32 of low resistance material is applied to substrate 12 having through hole 28 as illustrated in FIGS. 4 and 5. Layer 32 may be a thin sputtered or evaporated layer or a thicker layer produced by any of a number of known thick film or thin film or other processes. Layer 32 may be placed on one or both sides of the substrate.

Figure 7:
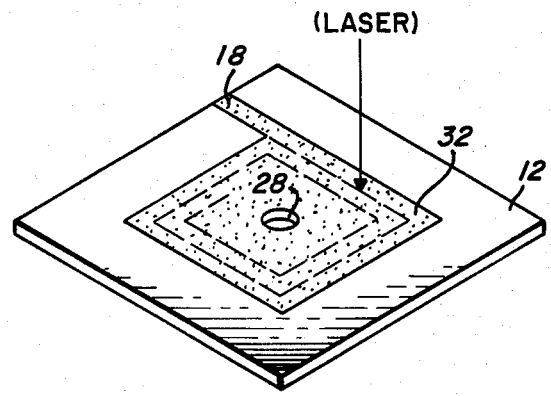
FIG. 7 is a perspective view of a substrate with a conductive layer deposited thereon and with a rectangular spiral pattern cut in the deposited layer as by laser.

Unlike the previous embodiment spiral coil 14 is not deposited on the conductive layer 32. Instead, a pattern is cut directly into the conductive layer 32 as shown in FIG. 7. This is preferrably accomplished by a laser but this is not to be limiting. As the laser cut shown in dashed lines in FIG. 7 increases in length, the inductance also increases until the desired value is reached. Utilizing a laser to cut the spiral pattern may result in improved line definition and more turns per inductor for a given substrate area. This technique may, however, result in excessive substrate heating if the conductive layer is thick and therefore difficult to cut, or decreased Q if their paths are cut and/or the conductive layer is thin. Reduced Q may be acceptable for many applications since this process may require one less metal deposition step.

Thus, it can be seen that a new improved planar inductance element has been provided by the present invention in which the inductance value thereof is considerably increased. The disclosed inductor is easily trimmable to vary the inductance value thereof either during initial fabrication or during a later operation of assembly.

It will be understood that the invention may be embodied in other specific forms without departing from the spirit or central charateristics thereof. The present examples and embodiments, therefore, are to be considered in all respects as illustrative and not restrictive, and the invention is not to be limited to the details given herein.

What is claimed is:
1. An inductor comprising:
   a generally flat substrate of electrically insulating material;
   a first substantially flat spiral coil disposed on one side of said substrate and having an inner end and an outer end;
   trimmable shorting means, disposed on said one side of said substrate, for electrically shorting portions of said first coil to facilitate adjustment of said inductor by selectively trimming said shorting means;
   a second substantially flat spiral coil disposed on the opposite side of said substrate and having an inner and an outer end;
   said inner ends of said first and second coils being joined through said substrate forming a continuous coil with said first coil spiraling in and said second coil spiraling out;
   said first and second coils being spiraled in the same direction as viewed from the outer end of each coil when each coil is viewed individually with said substrate oriented to position the viewed coil on the viewed side of said substrate so that an additive mutual inductive effect is achieved between said first and second coils resulting in an inductance greater than that of the sum of the inductance of the first and second coils; and
   said outer ends of said continuous coil providing terminals for the inductor.
2. The inductor of claim 1 wherein said coils have equal numbers of spirals.
3. The inductor of claim 2 wherein the area of said substrate covered by each of said coils is substantially equal.
4. The inductor of claim 1 wherein said outer end of said first coil and said outer end of said second coil lead away from the respective coils in generally diametrically opposite directions.
5. The inductor of claim 1 wherein said trimmable shorting means includes conductive paths joining and shorting at least some of the respective spirals of said continuous coil whereby said conductive paths may be discretely cut between the spirals to vary the inductance of the inductor.
6. The inductor of claim 1 wherein said trimmable shorting means includes a conductive layer shorting a portion of the spirals of said continuous coil whereby said layer may be progressively cut between the spirals to continuously vary the inductance of the inductor.
7. The inductor of claim 6 wherein said conductive layer is of low resistive material.
8. The inductor of claim 1 wherein said substrate is composed of a flexible material which may be deformed into a non-planar geometry.

* * * * *